United States Patent [19]

Gentsch et al.

[11] Patent Number: 5,345,203

[45] Date of Patent: Sep. 6, 1994

[54] RESONATOR ARRANGEMENT FOR ELECTRON SPIN RESONANCE SPECTROSCOPY

[75] Inventors: Ekkehard Gentsch, Rolandplatz; Dieter Schmalbein, Marxzell-Burbach, both of Fed. Rep. of Germany

[73] Assignee: Bruker Analytische Messtechnik GmbH, Silberstreifen, Fed. Rep. of Germany

[21] Appl. No.: 923,731

[22] Filed: Jul. 31, 1992

[30] Foreign Application Priority Data

Aug. 2, 1991 [DE] Fed. Rep. of Germany ........ 4125655

[51] Int. Cl.$^5$ ............................................. H01P 7/00
[52] U.S. Cl. .................................. 333/219; 333/219.1
[58] Field of Search ............... 333/219, 219.1, 230; 324/316, 318

[56] References Cited

U.S. PATENT DOCUMENTS

| | | | |
|---|---|---|---|
| 2,424,089 | 7/1947 | Gethmann | 333/219 |
| 2,429,811 | 10/1947 | Guarrera | 333/219 |
| 2,626,355 | 1/1953 | Hoffman et al | 333/219 |
| 2,890,422 | 6/1959 | Schlicke | 333/77 |
| 3,766,494 | 10/1973 | Anbe et al | 333/219 |
| 4,435,680 | 3/1984 | Froncisz et al | 333/219 |
| 4,446,429 | 5/1984 | Froncisz et al | 333/219 |
| 5,070,313 | 12/1991 | Gladh et al | 333/219.1 |

FOREIGN PATENT DOCUMENTS

| | | | |
|---|---|---|---|
| 0316813 | 11/1988 | European Pat. Off. | |
| 3029754 | 8/1980 | Fed. Rep. of Germany | G01N 24/04 |
| 0051804 | 3/1987 | Japan | 333/219.1 |
| 0299602 | 12/1988 | Japan | 333/219.1 |
| 0277302 | 11/1990 | Japan | 333/219.1 |

OTHER PUBLICATIONS

Satellite Multiplexing Using Dielectric Resonator Filters Fiedziuszko, Holme & Honmyo, Microwave Journal Dec. 1989.

*Primary Examiner*—Raymond A. Nelli
*Attorney, Agent, or Firm*—Claude A. S. Hamrick

[57] ABSTRACT

A resonator arrangement is provided for electron spin resonance spectroscopy. It comprises an annular, dielectric resonance ring 11 where field lines 13 of the resonance field emerge in the direction of the axis 12 of the resonance ring 11 and close in the outer space 18. There is further provided a coupling means for coupling and decoupling microwave energy into and out of the resonance ring 11. The coupling means comprises a coupling loop 14 which is arranged in the outer space 18 and adapted for being displaced in a direction 16 parallel to the axis 12.

11 Claims, 5 Drawing Sheets

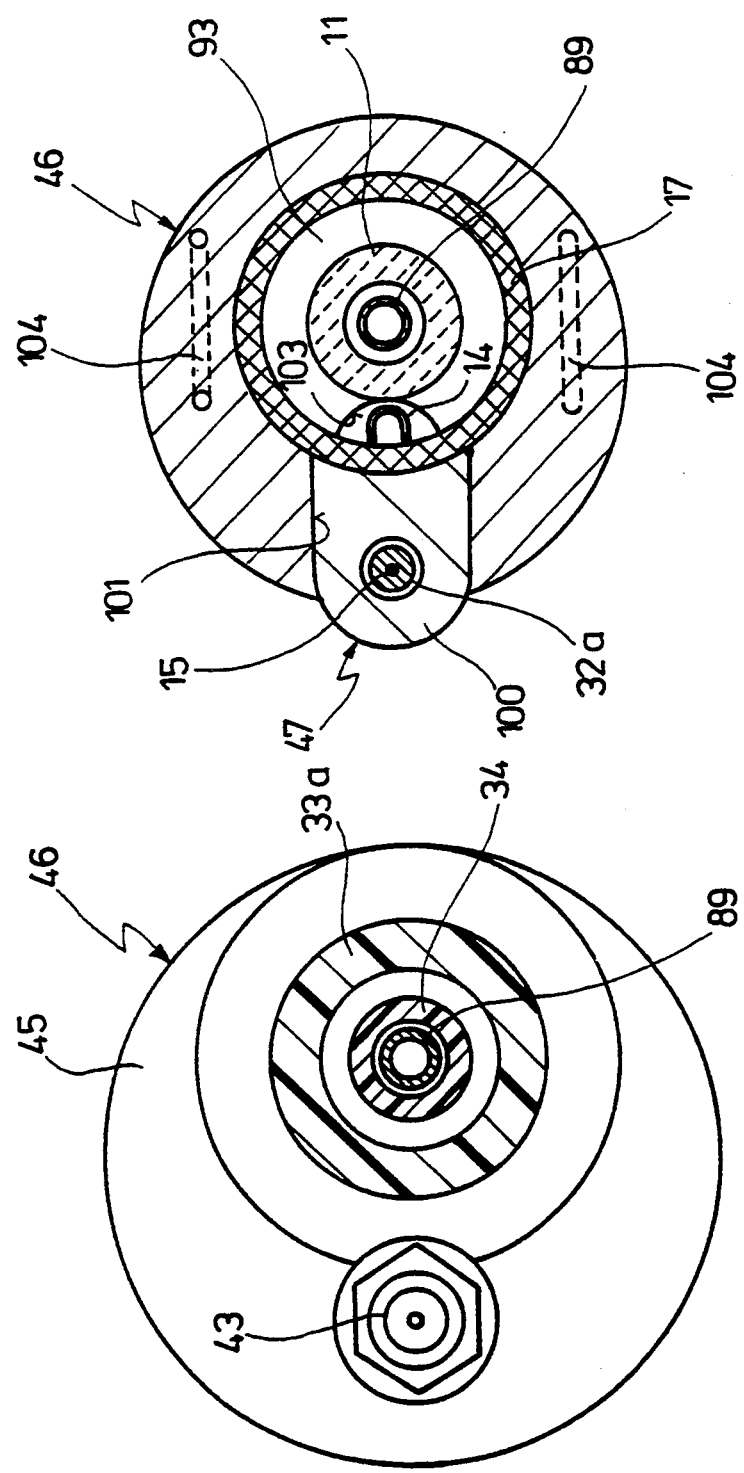

RESONATOR ARRANGEMENT FOR ELECTRON SPIN RESONANCE SPECTROSCOPY

BACKGROUND OF THE INVENTION

DESCRIPTION OF THE RELATED ART

The present invention relates to a resonator arrangement for electron spin resonance spectroscopy having an annular resonance ring where the field lines of the resonance field emerge in the direction in the resonance ring axis and close in the outer space, and coupling means for coupling and decoupling microwave energy into and out of the resonance ring.

A resonator arrangement of the before-described type has been known before.

In electron spin resonance spectroscopy, an electromagnetic HF field is generated where the field lines of the magnetic field have a predetermined direction. One then introduces a sample into this area of the resonator. During this process, the resonator is placed in a constant magnetic field of high homogeneity and field strength with the field lines of this magnetic field standing perpendicularly on the field lines of the magnetic microwave field.

There have been known numerous resonator arrangements in this connection, i.e. cavity resonators, helix resonators, and strip line resonators of the most different shapes, and in some cases it is also possible to excite in such resonators oscillation modes of different orders.

One group of such resonators, which is used for electron spin resonance measurements, consists essentially of a dielectric resonance ring, i.e. a hollow-cylindrical structure consisting of a crystal, usually a sapphire, which is capable of oscillating freely in space. The field lines of the magnetic microwave field generated as a result of such oscillation pass through the axial bore of the dielectric resonance ring in axial direction and close in the outer space. It is, therefore, possible to introduce a sample into the central bore of the resonance ring, where the sample material is then passed by the—substantially axially directed—field lines of the magnetic microwave field.

There have further been known, in connection with resonator arrangements for electron spin resonance spectroscopy, numerous coupling arrangements by means of which a microwave signal can be coupled into the resonator arrangement, and the generated measuring signals can be coupled out. These coupling devices may be of an inductive or of a capacitive nature; there have been known numerous designs used for establishing the desired coupling. A very commonly used configuration of a coupling arrangement consists of a coupling loop, i.e. an antenna-like structure, by means of which the desired oscillation mode can be excited in the resonator arrangement from the outside.

In the case of the known resonator arrangements using a coupling loop the latter is arranged in that area of the resonator arrangement where the microwave field intended to influence the sample is directly excited. If, therefore, the known resonator arrangement comprises a cylindrical cavity in which a $TE_{011}$ oscillation mode is excited, then the coupling loop may be located, for example, in a small end of the cylindrical hollow space in order to enclose in this area field lines which propagate at this point in radial direction.

Although such known resonator arrangements are well suited for many measuring applications, there also exist certain applications where resonator arrangements of this kind do not yield optimum results.

Pulsed electron spin resonance spectroscopy may be regarded as a typical example of such applications. In the case of this measuring technique, instead of feeding the microwave signal into the resonator in the form of a continuous-wave signal, the resonator arrangement is supplied with a pulsed microwave signal in order to examine specific dynamic processes in the sample.

It is a problem of this measuring technique that when a pulsed microwave signal is to be used, the resonator arrangement must have a large bandwidth. For, in the case of continuous-wave experiments the resonator Q may be, and should be, especially high in order to attain a good signal-to-noise ratio, whereas this is of course not the case with measurements using pulsed microwave signals that cover a broad frequency spectrum.

SUMMARY OF THE INVENTION

Now, it is the object of the present invention to further develop a resonator arrangement of the type described in such a way that when adjusting the coupling arrangement a large range of resonator Q values can be covered.

The invention solves this problem by the fact that the coupling device comprises a coupling loop which is arranged in the outer space and which can be displaced in a direction parallel to the axis.

This solves the object underlying the invention fully and perfectly. For, it has been surprisingly found that arranging the coupling loop in the outer space, i.e. not in or at the space accommodating the sample, enables the resonator Q value to be varied within a broad range. For example, it has been possible with test samples of the resonator arrangement according to the invention to carry out measurements in the X-band where the resonator Q value could be varied, by axial displacement of the coupling loop in the outer space of the resonator ring, within a Q range of between 100 and 5000.

It is thus possible for the resonator arrangement according to the invention to be optimally coupled for the most different measurements, including pulsed measurements, and this irrespective of whether the sample is one having low or high dielectric losses.

According to preferred embodiments of the arrangement according to the invention, the coupling loop is arranged at an axial distance and/or at a radial distance from the resonator ring.

These features provide the advantage that coupling to the resonator ring is possible both in the radial and in the axial neighborhood, and also in the overlapping area of those surroundings.

According to other preferred embodiments of the invention, the resonator ring is surrounded by a cylindrical screening.

This feature provides the advantage that the microwave field is concentrated in the outer space and rendered reproducible. Thus, any undesirable influences on the microwave field from the outside is no longer possible or will have far lesser effects.

Preference is given in the case of this embodiment to an arrangement where the screening consists of at least one layer of wound wire.

This feature provides the advantage that firstly the screening can be produced in a simple way, for example by embedding a wire spiral in a suitable cast resin. On the other hand, this feature also has the advantage that it provides perfect screening at microwave frequencies, while it is pervious for a modulation field at very low frequencies (in the audio range). This makes it possible to superimpose upon the constant magnetic field of high homogeneity a modulation field in order to enable the measuring signal to be encoded in a suitable way and to be evaluated by lock-in techniques.

The advantages described above can be further refined by giving the screening a multi-layer structure so that a plurality of layers of wound wire are arranged one above the other.

According to a particularly preferred group of embodiments of the invention, the screening is rigidly connected to the coupling loop and can be displaced together with the latter.

This feature provides the advantage that the point where the microwave cable passes through the screening can be kept rigid, and that in particular no oblong holes, or the like, are required which would impair the desired development of the microwave field.

An especially good effect is achieved in this connection when the screening is held in an axial guide in a resonator housing.

This feature provides the advantage to establish a sturdy mechanical structure which enables the combination of coupling loop and screening to be safely moved in the resonator housing without giving rise to any disturbances.

According to a further particularly preferred variant of this embodiment, the screening is supported on the resonator ring, which is held in the resonator housing, via a spring.

This feature has the advantage to provide an elastically pre-stressed arrangement which is fully serviceable even at low temperatures or under varying temperature conditions. If in the case of heavily varying temperatures the components of the resonator arrangement should contract or expand, these movements can be absorbed easily by an elastically pre-stressed arrangement, due to the fact that the spring will extend or be compressed correspondingly, while in the case of an arrangement rigidly connected by screws or by an adhesive there would always be a risk of cracking.

According to still other preferred embodiments of the invention, the screening can be displaced by means of a long coupling rod. Preferably, the latter substantially consists of an at least semi-rigid microwave cable.

These features provide the advantage that the desired displacement of the coupling loop can be effected in an extremely simple way by a simple axial movement. Finally, the fact that the coupling rod and the microwave cable are united in a single component provides the advantage of a simple arrangement where the "microwave cable" component serves a dual function.

According to another preferred group of embodiments, the coupling rod can be divided by a plug-in connection.

This feature provides the advantage that modular resonator concepts can be implemented where the lower part, i.e. the measuring portion comprising the resonance structure, can be exchanged for different measuring tasks, while the upper part, i.e. the connection element, of the resonator arrangement remains unchanged.

According to another preferred group of embodiments of the invention, the coupling rod can be adjusted at the end of the resonator arrangement opposite the resonator ring by means of a lever coupling mechanism.

This feature provides the advantage that precise adjustment of the coupling rod is rendered possible, by suitable selection of the lever ratio.

Other advantages of the invention will appear from the specification and the attached drawing.

It is understood that the features that have been mentioned before and that will be described hereafter may be used not only in the stated combinations, but also in any other combination or each alone, without departing from the scope of the present invention.

BRIEF DESCRIPTION OF THE DRAWINGS

Some embodiments of the invention will now be described in more detail with reference to the drawing in which

FIG. 7 shows a sectional representation taken along line VII—VII in FIG. 6, in still further enlarged scale; and FIG. 8 shows a representation similar to that of FIG. 7, but taken along line VIII—VIII in FIG. 6.

DESCRIPTION OF THE PREFERRED EMBODIMENTS

Figure 1:
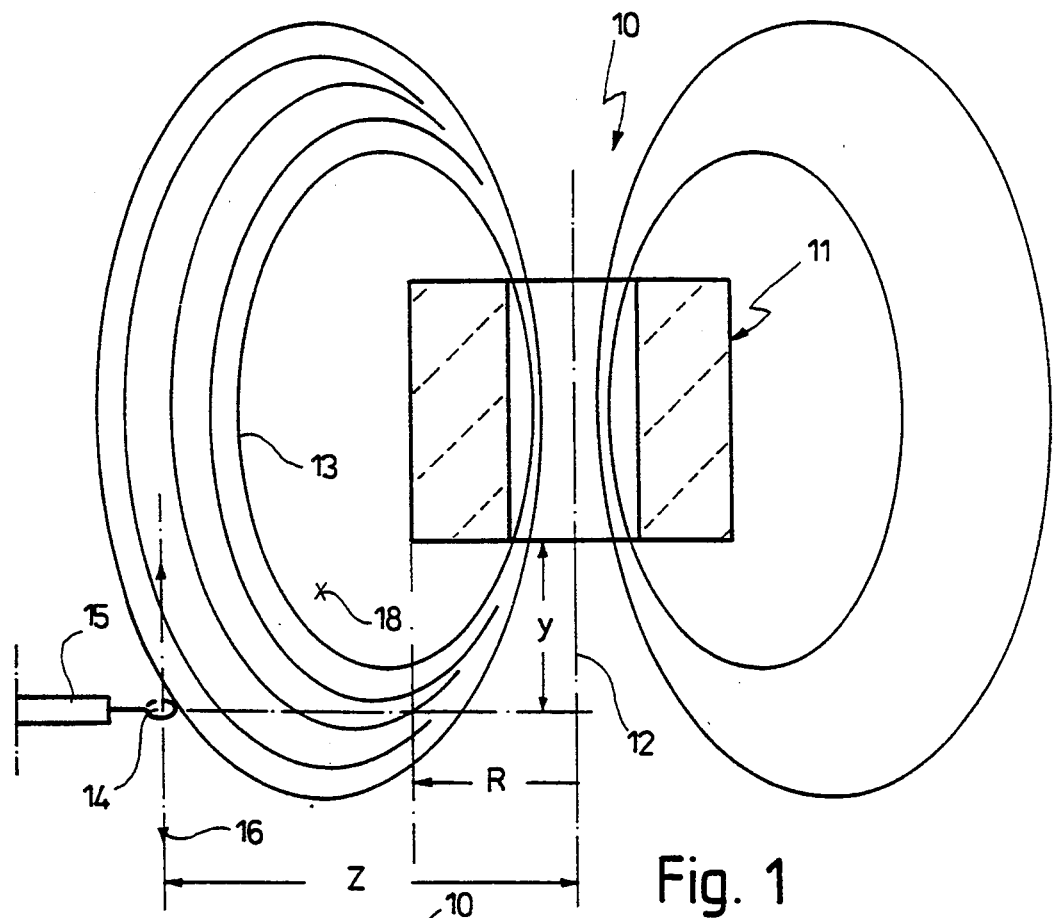
FIG. 1 shows a diagrammatic side view of a resonator arrangement for electron spin resonance experiments comprising a dielectric resonator ring.

In FIG. 1, a resonator arrangement of the type suited for electron spin resonance measurements is indicated generally by reference numeral 10.

11 designates a dielectric ring, i.e. in the illustrated embodiment a hollow-cylindrical body consisting preferably of a sapphire ring. The sapphire ring 11 has a central axis 12. Field lines 13 indicating the electromagnetic microwave field extend within the sapphire ring 11 approximately in parallel to the axis 12 and close in the outer space 18.

Reference numeral 14 indicates a coupling loop provided at a free end of a microwave cable 15, which is indicated in the drawing only in part. The coupling loop 14 serves to excite in the sapphire ring 11 the microwave field symbolized at 13, and/or to couple out measuring signals.

As can be clearly seen in FIG. 1, the coupling loop 14 preferably is positioned in such a way as to be spaced from the bottom face of the sapphire ring 11 by a distance y, viewed in the direction of the axis 12. In addition, there exists a radial spacing z between the coupling loop 14 and the axis 12, the spacing z being greater than the outer radius R of the sapphire ring 11. Generally speaking, the coupling loop 14, therefore, is preferably located radially outside of, and at an axial distance from the sapphire ring 11.

Arrow 16 indicates that the coupling loop 14 can be displaced in the direction of the axis 12. It has been found that displacing the coupling loop 14 in the direction of arrow 16 enables the coupling of the sapphire ring 11 to be varied in the desired manner, which is desirably for electron spin resonance experiments on different samples, with different temperatures, or the like.

Figures 2, 3:
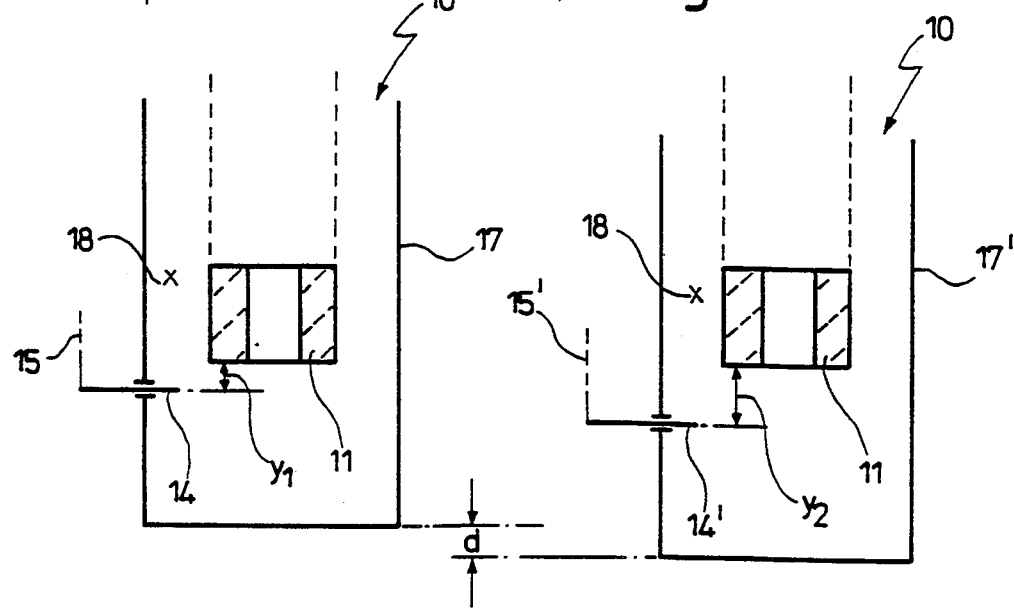
FIG. 2 shows an arrangement similar to that of FIG. 1, but in reduced scale and in a first operating condition.
FIG. 3 shows a representation similar to that of FIG. 2, but in a different operating condition.

Although the sapphire ring 11, being a dielectric ring resonator, is capable also of oscillating freely in space, arrangements are preferred where the ring 11 is enclosed by a screening 17, as illustrated in FIGS. 1 and 3. The screening 17 acts to concentrate the microwave field and to render the latter insensitive to external influences, when certain elements on or in the neighborhood of the ring 11 must be adjusted.

FIG. 2 shows that the microwave cable 15 is passed through a suitable bushing in the jacket of the screening 17 so that the coupling loop 14 finds itself in the outer space 18 between the screening 17 and the ring 11. In the operating condition illustrated in FIG. 2, the coupling loop 11 would then be spaced from the bottom face of the ring 11 by a distance $y_1$.

The broken lines in FIGS. 2 and 3 indicate that for the purposes of the present considerations the ring 11 is held in stationary condition. This is important and desirable for electron spin resonance experiments because the position of the ring 11 in space simultaneously defines the position of the sample located in the ring 11. If, for example, the sample is to be irradiated or to be treated in some other way during an electron spin resonance measurement, then it is desirable for the position of the sample to be maintained as constant as possible and this even in case some adjustment, for example of the coupling device, should be necessary.

It is for this reason that in the case of the microwave resonator 10 according to the invention the coupling loop 14 moves jointly with the screening 17 relative to the ring 11 if the coupling conditions are to be varied. This can be seen clearly when comparing FIGS. 2 and 3, as in the condition illustrated in FIG. 3 the screening 17' has been lowered by an amount d below the position of the screening 17 in FIG. 2. This has the consequence that the spacing y between the coupling loop 14 and the ring 11 increased from the value $y_1$ in FIG. 2 to the value $Y_2$ in FIG. 3 because the ring 11 remained fixed in space.

Figure 4:
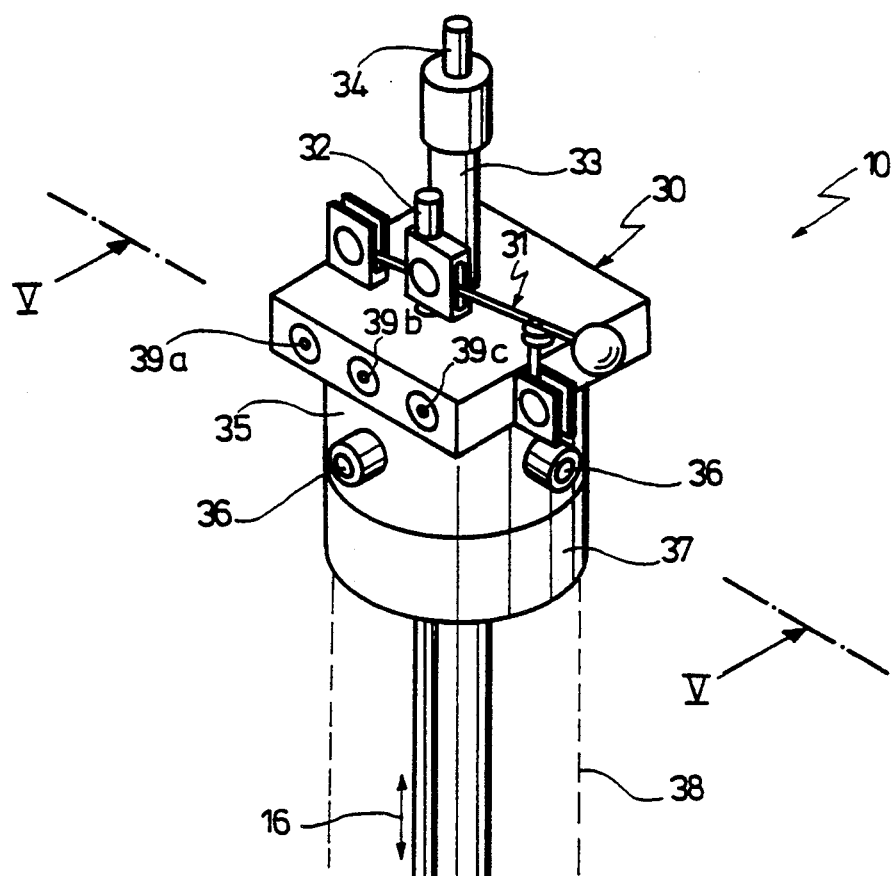
FIG. 4 shows a perspective side view of one embodiment of a resonator arrangement according to the invention.
Figure 4:
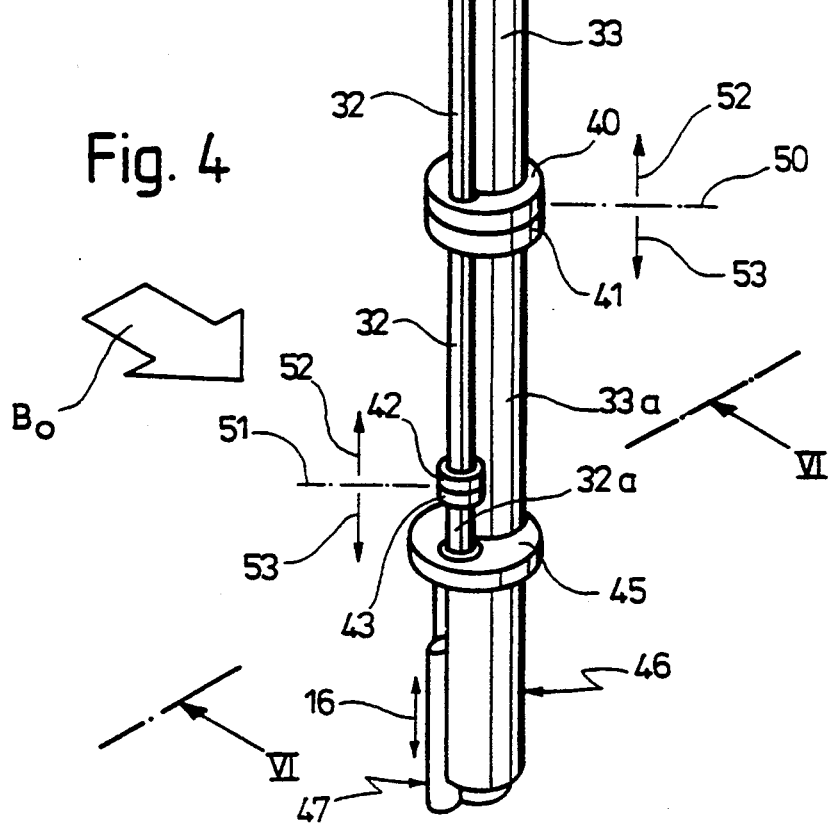

FIG. 4 shows a perspective overall view of one embodiment of a microwave resonator 10 according to the invention.

FIG. 4 will be more easily understood if one realizes that microwave resonators 10 for electron spin resonance experiments usually are long structures with the connections of the microwave line, i.e. a hollow waveguide or a coaxial cable, just as the connections for a modulation signal, for temperature control agents, sensors, and the like, being arranged on the upper end thereof. These installations are then followed by a long central section whose length is selected in such a way that a resonator section located at the lower end can be introduced between pole shoes of a laboratory magnet without this action being obstructed by the normally protruding upper end which is considerably larger than the lower resonator section. It is thus possible to introduce the lower, narrow resonator section into a relatively narrow air gap between two pole shoes of the magnet, while the upper end remains a long way outside of the pole shoes; this provides much more room for the laboratory magnets to establish the necessary connections and to introduce temperature-control agents.

In the case of the resonator 10 according to FIG. 4, a carrier plate 30 can be seen at its upper end, with a coupling mechanism 31 intended to adjust the coupling being mounted thereon. The coupling mechanism 31 will be described in more detail further below, by reference to FIG. 5.

The coupling mechanism 31 is designed in such a way that a vertical coupling rod 32 can be displaced in vertical direction, as indicated again by arrow 16 in FIG. 4.

A rigid sample tube 33, into which a sample rod 34 can be introduced, extends in parallel to the coupling rod 32 and through the carrier plate 30, being held by the latter. The arrangement will be described in more detail further below.

Connected to the bottom of the carrier plate 30 is a temperature-control chamber 35 provided with connections 36 for a temperature-control agent, preferably water.

Below the temperature-control chamber 35, one can see a cryostat flange 37 whose lower face is adapted for connection of a cryostat 38, serving for example for adjusting the temperature to the temperature of liquid nitrogen or of liquid helium. In this case, the temperature-control chamber 35 serves for decoupling the carrier plate thermally from the cryostat 38. This is achieved by guiding a suitable quantity of temperature-control agents through the connections 36 to ensure that low temperatures cannot be transmitted from the area of the cryostat 38 in upward direction and into the area of the carrier plate 30 and the units mounted thereon.

39a, b, and c finally symbolize plug-in connections which can be used, for example, for introducing a modulation signal for modulation coils of the resonator 10, or for picking off the signal of a thermoelement.

As can be clearly seen in FIG. 4, the sample tube 33, extending a long way in downward direction and away from the carrier plate 30, terminates by a flange 40 which is matched by a corresponding counter-flange 41. The counter-flange 41 is followed, in downward direction, by another length of the sample tube forming a separating element 33a.

The same applies by analogy to the coupling rod 32 which, extending initially through the flanges 40, 41, then terminates in downward direction by a connector 42 connected to a matching connector element 43. Following the matching connector element 43, the coupling rod then extends further in downward direction as coupling rod 32a.

As a result of this arrangement, separating planes 50 and 51 are formed in the area of the coupling tube 33/33a and the coupling rod 32/32a, respectively, along which the microwave resonator 10 can be divided into an upper part 52 and a lower part 53, as indicated by the arrows in FIG. 4. This feature makes it possible to use one and the same upper part 52 in combination with a plurality of different lower parts 53, for example lower parts 53 adapted for different measuring frequencies, measuring temperatures, measuring techniques (for example irradiation), or the like.

The sample tube 33a and the coupling rod 32a terminate at their lower end, in the area of the lower part 53, by a flange 45 which is followed in downward direction by a resonator housing 46 and a coupling and screening element 47 that will be discussed in more detail further below in connection with FIG. 6.

Finally, $B_0$ in FIG. 4 indicates the direction of the constant magnetic field to which the lower part 53 is exposed.

Figure 5:
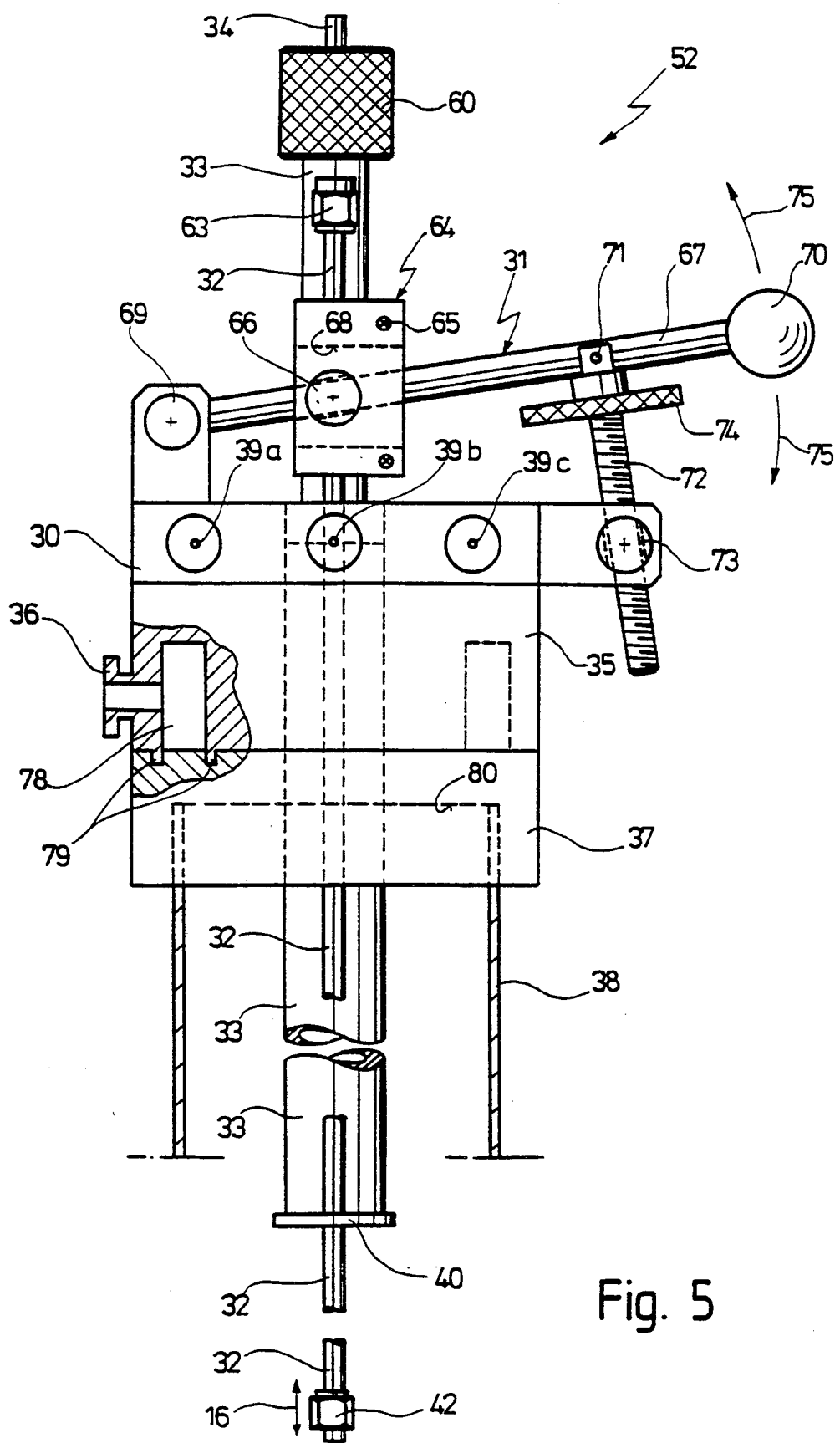
FIG. 5 shows a side view in the direction of arrows V—V in FIG. 4 of the upper part of the resonator arrangement illustrated in FIG. 4, in enlarged scale.

FIG. 5 shows further details of the upper part 52.

As regards the sample tube 33, it can be seen that its upper end is provided with a chuck 60. In its released condition, the chuck 60 enables the sample rod 34 to be introduced from above, whereafter the rod 34 can be secured in the measuring position by tightening the chuck 60.

The coupling rod 32 consists essentially of a rigid or semi-rigid microwave line, preferably a semi-rigid coaxial microwave cable, which may be mechanically stabilized, at least over certain sections, by an additional reinforcing tube, or the like. The upper end of the coupling rod 32 terminates by a connector 63 through which microwave energy can be introduced, or signals coupled out from the resonator can be picked off.

A short way below the connector 63, the coupling rod 32 is rigidly held, in axial direction, in a drive element 64. This is effected by clamping screws 65 by which the coupling rod 32 is clamped in the drive element 64. The drive element 64 is part of the coupling mechanism 31 which will now be discussed in greater detail:

The drive element 64 is provided with a combined pivot and sliding bearing 66 in which a rod 67, which in the view of FIG. 5 can be seen in front of the coupling rod 32, is supported for axial displacement in a direction perpendicular to the drawing plane, while it can also swing about the axis of the combined pivot and sliding bearing 66. The rod 67 is passed for this purpose through an oblong hole 68 in the drive element 64, and its left end—as viewed in FIG. 5—is fastened in a pivot bearing 69 of the carrier plate 30. The right end of the rod 67 is provided with a handle 70 by means of which the rod 67 can swing about the axis of the pivot bearing 69, as indicated by arrows 75.

Between the drive element 64 and the handle 70, a threaded spindle 72 is connected to the rod 67 via an articulation 71. The threaded spindle 72 is held in a combined pivot and sliding bearing 73 of the carrier plate 30 in sliding and swinging relationship. This makes it possible for the rod 67 to perform the swinging movement indicated by arrows 75. In order to enable the rod 67 to be locked in a given angular position, a knurled nut 74 is mounted on the threaded spindle 72. The knurled nut 74 can be screwed against the combined pivot and sliding bearing 73 in order to thereby fix the threaded spindle 72 in axial direction.

It will be easily appreciated that any swinging movement of the rod 67 in the direction indicated by arrows 75 will automatically entail a displacement of the drive element 64 in vertical direction whereby the coupling rod 32 is displaced in the direction of arrow 16.

In FIG. 5 it can be further seen that the temperature-control chamber 35 is provided with an annular space 78 that communicates with the connections 36 which are indicated only diagrammatically, with one of them being illustrated in FIG. 5. It can be ensured in this way that, provided a sufficient quantity of a temperature-control agent is circulated, the temperature-control chamber 35 can always be maintained at a uniform temperature, preferably near room temperature, even if a considerably lower temperature should prevail at the bottom of the temperature-control chamber 35, in the area of the cryostat flange 37.

The temperature-control chamber 35 and the cryostat flange 37 are interconnected by a labyrinth seal 79—indicated only diagrammatically in FIG. 5—so that once the temperature-control chamber 35 and the cryostat flange 37 have been joined, the annular spaces 78 is hermetically sealed.

The cryostat flange 37 is provided on its lower face with a recess 80 in which the cryostat 38 can be fitted.

In the case of the embodiment illustrated in the drawing, the cryostat 38 is indicated in the form of a nitrogen cryostat, i.e. a long evacuated glass vessel in whose interior the temperature of the liquid nitrogen can be maintained. It is understood, however, that reference numeral 38 may also be interpreted to indicate a helium cryostat, which must have a considerably more complex structure in order to enable the temperature of liquid helium to be adjusted in its interior.

Figure 6:
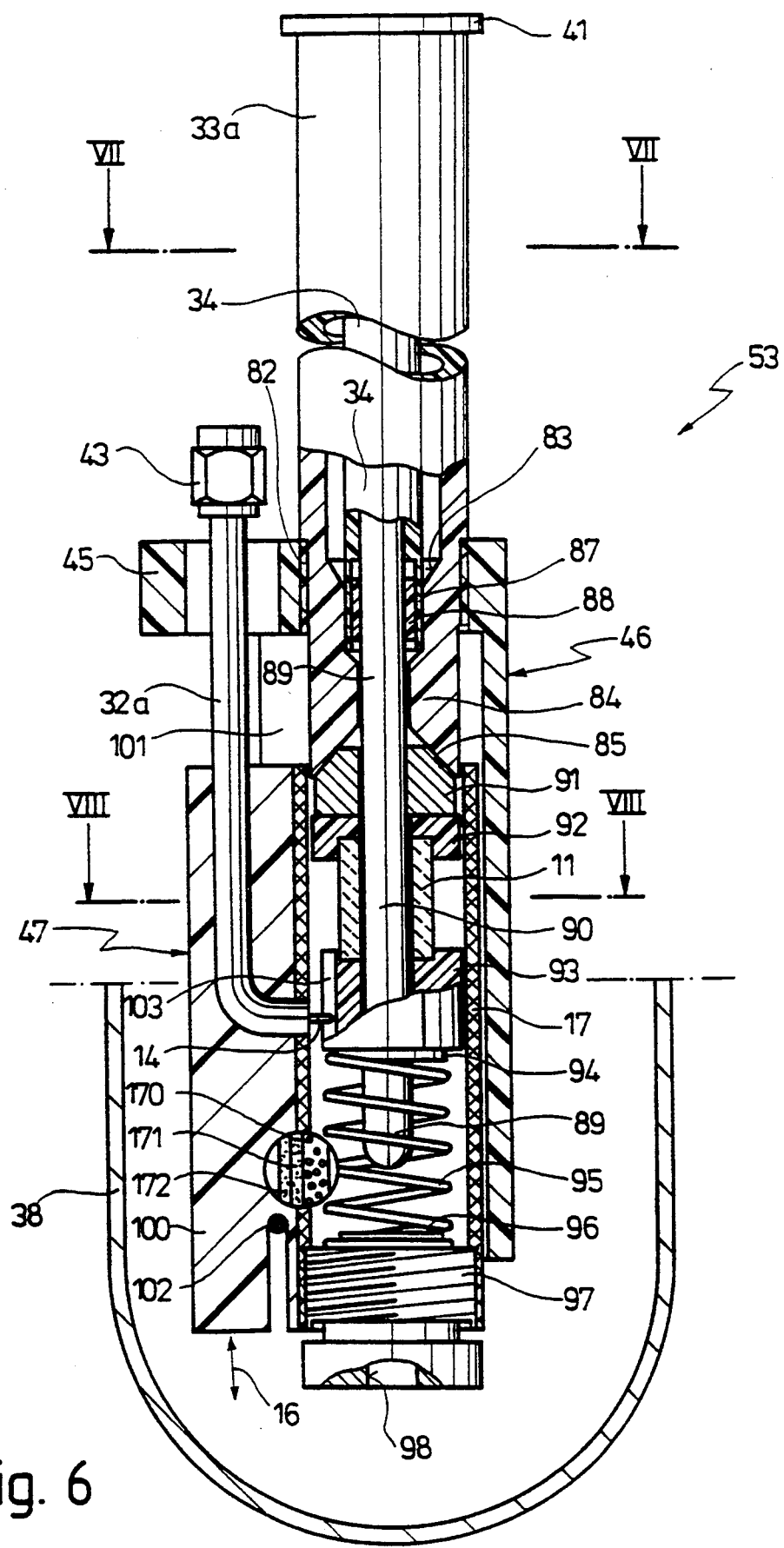
FIG. 6 shows a side view, cut open in part, in the direction of arrows VI-VI in FIG. 4, depicting the lower part of the resonator arrangement in still further enlarged scale.

FIG. 6 shows further details of the lower part 53 of the resonator 10.

As regards the sample tube 33a, it will be seem immediately in FIG. 6 that its lower end is screwed into the flange 45 by means of a thread 82. In the area of the thread 82, the sample tube 33a is provided with an internal, conically tapering centering portion 83 terminating at the bottom by a guide section 84 of reduced diameter, which latter is then followed by an internally conical section 85 opening up again toward the bottom.

The sample rod 34 is guided in concentric relationship to the sample tube 33a. The sample rod 34 consists, preferably, of a glass fiber-reinforced plastic material. The sample rod 34 can be withdrawn from and re-inserted into the sample tube 33 or 33a during an experiment so that samples can be exchanged even during measurements carried out at low temperatures, without the need to remove the entire resonator portion of the resonator 10 from the cold area of the cryostat 38.

The lower end of the sample rod 34 terminates by a terminal section 87 provided with an internal thread. Fitted in the internal thread is a clamping nut 88 serving to clamp a sample tube 89. The sample tube 89 contains a sample 90 to be examined.

Contrary to all the other elements that have been described above and all of which consist of a plastic material, a centering cone 91, which is fitted in the internally conical section 85 from below, consists of a metal.

The centering cone 91 is followed, in downward direction, by an upper holding element 92 supporting the top of the sapphire ring 11. The bottom of the sapphire ring 11 is held by a lower holding element 93. The bottom of the lower holding element 93 is provided with a spigot 94 for a compression spring 95. The lower end of the compression spring 95 is compressed around a spigot 96 of a metallic or microwave-absorbent closure screw 97. The closure screw 97 is provided with a passage bore 98 in order to permit the sample tube 89 to extend further in downward direction than indicated by way of example in FIG. 6.

FIG. 6, regarded in combination with FIG. 8, further shows clearly the structure of the coupling and screening element 47 and the way in which it is guided in the resonator housing 46.

The element 47 consists essentially of a screening 17 in the form a tube. The lower end of the tube is engaged by the closure screw 97 which is screwed into the tube by a corresponding thread.

The tube as such preferably consists of three layers 170, 171, 172 which are depicted more clearly in the enlarged detail in FIG. 6.

Each layer 170, 171, 172 consists of a wire coil, the innermost layer 170 being wound from a somewhat thicker wire, while the outer layers 171, 172 are wound from a somewhat thinner wire. This measure serves the purpose to achieve a screening 17 which on the one hand is tight under HF aspects but which on the other hand allows a low-frequency modulation field to pass.

One end of the tube of the screening 17 is provided with a lug 100 engaging a corresponding groove 101 in the resonator housing 46. A locking pin 102 ensures that the coupling and screening element 47 cannot get disengaged from the resonator housing 46 in downward direction under the action of the compression spring 95.

Now, when the coupling mechanism 31, which has been described in detail further above by reference to FIG. 5, is actuated to displace the coupling rod 32a in vertical direction—as viewed in FIG. 6—then this has the effect to move the coupling and screening element 47 together with the screening 17 relative to the resonator housing 46 in the direction indicated by arrow 16, and the compression spring 95 is simultaneously compressed or released, respectively.

The coupling loop 14 occupies in this case for example the position outside of and below the sapphire ring 11, as illustrated in FIG. 6 and as described above in connection with FIG. 1. In order to ensure undisturbed displacement of the coupling loop 14, the respective area of the lower holding element 93 is provided with a vertical groove 103 which can be clearly seen in FIGS. 6 and 8.

Finally, FIG. 8 further shows that modulation coils 104 are arranged on, or molded into the resonator housing 46, conveniently on both sides of the tubular screening 17.

For operation of the resonator according to the invention, one initially selects a suitable lower element 53 for the experiment to be carried out, which must be suited, for example, for the desired measuring frequency (for example X-or Q-band) or for a given measuring temperature (for example room temperature, temperature of liquid nitrogen or of liquid helium) or for a given measuring technique (for example measurement under irradiation, under defined angular rotation).

For this purpose, the arrangement is such that all these different lower parts 53 can be fitted on the same upper part 52.

Once the resonator 10 has been assembled in this way, it is brought into the measuring position, i.e. introduced between the poles of the laboratory magnet and, if necessary, into a cryostat 38.

One then introduces the sample 90, or a corresponding sample substance, into the sample tube 89. The filled sample tube 89 is clamped in the clamping nut 88 in the terminal portion 87 of the sample rod 34. With the chuck 60 in the released condition, one then introduces the sample rod 34 into the sample tube 33 from above. When the sample tube 89 assumes the position illustrated in FIG. 6, in which the sample 90 is located in the sapphire ring 11, one tightens the chuck 60 so as to fix the sample rod 34 in its position in the sample tube 33.

One can now proceed to carrying out the electron spin resonance measurement. To this end, one initially establishes the necessary coupling to the sapphire ring 11 by untightening the knurled nut 74 on the threaded spindle 72 of the coupling mechanism 31 (FIG. 5) and displacing the rod 67 by means of the handle 70 in the direction indicated by arrow 75 until optimum coupling to the sapphire ring 11 is achieved.

One then fixes the rod 67 and, thus, the coupling loop 14 via the coupling mechanism 31 and the coupling rod 32, in their respective positions by tightening the knurled nut 74 against the combined pivot and sliding bearing 73.

Now, the electron spin resonance measurement as such can be carried out.

If the sample is to be exchanged, this is possible in a simple way be removing the sample rod 34, together with the sample tube 89, from the sample tube 33 and introducing it again, filled with a new sample, and after the coupling conditions have again been optimized the next measurement can be carried out. It is, therefore, not necessary to remove the entire resonator 10 from the air gap of the magnet, or at least from the cryostat, if one is employed.

We claim:

1. A resonator for electron spin resonance spectroscopy, comprising:
   annular dielectric resonance means having an axis and generating a microwave electromagnetic field having field lines extending essentially parallel to said axis within said annular dielectric resonance means and being closed around said annular dielectric resonance means;
   coupling means comprising a coupling loop for coupling microwave energy to and from said annular dielectric resonance means;
   cylindrical shielding means surrounding said annular dielectric resonance means and rigidly connected to said coupling loop; and
   means for displacing said shielding means with said coupling loop rigidly connected thereto along a direction parallel to said axis.

2. The resonator of claim 1, wherein said coupling loop is arranged at an axial distance from said annular dielectric resonance means.

3. The resonator of claim 1, wherein said coupling loop is arranged at a radial distance from said annular dielectric resonance means.

4. The resonator of claim 1, wherein said shielding means includes at least one layer of wound wire.

5. The resonator of claim 4, wherein said shielding means includes a multi-layered structure.

6. The resonator of claim 1, further comprising a resonator housing having axial guiding means for guiding said shielding means with said coupling loop rigidly connected thereto.

7. The resonator of claim 6, further comprising spring means for supporting said shielding means on said annular dielectric resonance means, said annular dielectric resonance means being held in said resonator housing.

8. The resonator of claim 1, wherein said displacing means includes an elongate coupling rod for displacing said shielding means.

9. The resonator of claim 8, wherein said coupling rod includes a semi-rigid microwave cable.

10. The resonator of claim 8, wherein said coupling rod is subdivided by means of a plug connector.

11. The resonator of claim 8, further comprising a lever coupling mechanism provided on an end of said resonator opposite said annular dielectric resonance means for adjusting said coupling rod.

* * * * *